(12) United States Patent
Ku et al.

(10) Patent No.: US 6,764,961 B2
(45) Date of Patent: Jul. 20, 2004

(54) METHOD OF FORMING A METAL GATE ELECTRODE

(75) Inventors: Ja-Hum Ku, Sungnam-shi (KR); Mahn-Ho Cho, Seoul (KR); Chul-Joon Choi, Koyang-shi (KR); Seong-Jun Heo, Seoul (KR); Jun-Kyu Cho, Kwangju (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/992,980

(22) Filed: Nov. 6, 2001

(65) Prior Publication Data

US 2002/0137321 A1 Sep. 26, 2002

(30) Foreign Application Priority Data

Mar. 23, 2001 (KR) .......................................... 2001-15150

(51) Int. Cl.[7] .............................................. H01L 21/31
(52) U.S. Cl. .................. 438/770; 438/785; 257/412
(58) Field of Search .................................. 438/770–773, 438/572, 785, 253, 396, 592–594; 257/386, 394, 412

(56) References Cited

U.S. PATENT DOCUMENTS

| | | | | |
|---|---|---|---|---|
| 4,505,028 A | * | 3/1985 | Kobayashi et al. | 29/578 |
| 4,505,082 A | * | 3/1985 | Kobayashi et al. | 29/578 |
| 5,633,212 A | * | 5/1997 | Yuuki | 438/773 |
| 6,197,702 B1 | * | 3/2001 | Tanabe et al. | 438/773 |
| 6,284,634 B1 | * | 9/2001 | Rha | 438/592 |
| 6,323,115 B1 | * | 11/2001 | Tanabe et al. | 438/592 |
| 6,348,380 B1 | * | 2/2002 | Weimer et al. | 438/257 |

* cited by examiner

Primary Examiner—Matthew Smith
Assistant Examiner—Calvin Lee
(74) Attorney, Agent, or Firm—Mills & Onello, LLP

(57) ABSTRACT

The present invention includes a method of forming a metal gate electrode on which whiskers are not formed after performing a selective oxidation process and a subsequent heating process. The metal gate electrode is formed by forming a metal gate electrode pattern which is comprised of a polysilicon layer and a metal layer, and performing a selective oxidation process. After the selective oxidation process, the metal gate electrode undergoes a subsequent heating treatment. The selective oxidation process is carried out in a nitrogen containing gas ambient, so that a metal oxide layer is minimally formed on the metal layer. As a result, it is prevented from causing whiskers on the metal layer.

7 Claims, 5 Drawing Sheets

24

METHOD OF FORMING A METAL GATE ELECTRODE

This application relies for priority upon Korean Patent Application No. 2001-15150, filed on Mar. 23, 2001, the contents of which are herein incorporated by reference in their entirety.

FIELD OF THE INVENTION

The present invention generally relates to a method of making a semiconductor device and, more specifically, to a method of forming a metal gate electrode.

BACKGROUND OF THE INVENTION

A gate electrode is fabricated by forming a conductive film having a uniform thickness on a semiconductor substrate and subsequently etching the conductive film to be a predetermined shape. Generally, polysilicon has been used to make a typical gate electrode due to its excellent interface characteristics with a gate oxide at a high temperature. However, as the semiconductor devices are becoming highly integrated, the typical polysilicon gate electrode cannot satisfy manufacturers of the semiconductor devices with its operation speed and sheet resistance. Thus, a metal gate electrode comprised of a polysilicon and a refractory metal such as tungsten formed on the polysilicon has been used. However, the metal gate electrode has a problem due to an abnormal oxidation that is caused by excellent oxidation characteristics of tungsten used for metal gate electrodes.

FIGS. 1A, 1B, 2A and 2B are cross-sectional views showing a method of making a metal gate electrode in accordance with the conventional art.

First, as shown in FIG. 1A, a gate oxide layer 12 is formed on a semiconductor substrate 10. Then, a polysilicon layer 14, a tungsten layer 16 and a gate electrode capping layer 18 are sequentially formed on the gate oxide layer 12. Further, a conductive barrier layer (not shown) is formed between the polysilicon layer 14 and the tungsten layer 16 to prevent a chemical reaction therebetween. Next, a gate electrode 20 is formed by sequentially etching the gate electrode capping layer 18, the tungsten layer 16, the polysilicon layer 14 and the gate oxide layer 12. Subsequently, an oxidation process is performed to cure damage 22 on the semiconductor substrate 10 and ensure reliability of the gate oxide layer 12. As a result, as shown in FIG. 1B, the damage 22 is cured and an oxide layer 12a is formed on the semiconductor substrate 10 and side walls of the polysilicon layer 14 and the gate oxide layer 12. However, an abnormal oxidation 12b is caused on side walls of the tungsten layer 16 because an oxidation rate of the tungsten layer 16 is higher than that of the polysilicon layer 14. Accordingly, to prevent the abnormal oxidation 12b during forming a metal gate electrode, a selective oxidation process has been developed. The selective oxidation process oxidizes only silicon layer but does not oxidize a metal layer after patterning a metal gate electrode. The selective oxidation process is performed by adjusting partial pressures of hydrogen gas and $H_2O$ to selectively oxidize the silicon layer. Further, partial pressures are adjusted by controlling oxygen gas and hydrogen gas of a source gas. For example, the selective oxidation process such as wet hydrogen oxidation selectively oxidizes silicon by controlling the following chemical reaction.

$$Si+2H_2O \rightleftharpoons SiO_2+2H_2 \tag{1}$$

$$W+3H_2O \rightleftharpoons WO_3+3H_2 \tag{2}$$

That is, by controlling the partial pressures of $H_2O$ and the hydrogen gas, reactions are favored toward the right side in equation 1 and in the direction of the left side in equation 2, respectively. Therefore, the oxidation of tungsten can be prevented.

However, the selective oxidation process described above has a narrow process margin, and it is difficult to adjust the partial pressures of the hydrogen gas and $H_2O$ to only oxidize the silicon. Accordingly, as shown in FIG. 2A, a small amount of the tungsten is oxidized, so that tungsten oxide 12c is formed on side walls of the tungsten layer 16. As shown in FIG. 2B, the insulative tungsten oxides 12c causes whiskers 24 due to a thermal energy that is applied to the tungsten oxide 12c during a heating process of subsequent semiconductor device manufacturing processes. Thus, an electrical short between the gate electrodes adjacent each other can be caused by the whiskers. The whiskers 24 are formed due to an amorphous phase and nucleation cites on the surface of the tungsten oxide 12c. That is, surface mobility of the tungsten oxide 12c having amorphous phase is increased by the thermal energy during a heating process, then the amorphous tungsten oxide 12c is moved toward the nucleation cites and crystallized at the nucleation cites, so that the whiskers 24 are formed. Accordingly, it is required to completely suppress the oxidation reaction of the tungsten during the selective oxidation process.

SUMMARY OF THE INVENTION

It is, therefore, an object of the present invention to provide a method of forming a metal gate electrode that is capable of preventing whiskers by ensuring reliability of a selective oxidation process.

In accordance with one aspect of the present invention, there is provided a method of making a metal gate electrode wherein a selective oxidation process to be performed after patterning the metal gate electrode is carried out under a nitrogen containing gas ambient to ensure a reliability of the selective oxidation process.

In the method of making the metal gate electrode according to the present invention, the nitrogen containing gas prevents a metal layer of the metal gate electrode from being oxidized. The reason is that nitrogen is unstably combined with the metal layer having high reactivity, so that it prevents the metal layer from reacting with oxygen. Further, the nitrogen containing gas suppresses formation of the nucleation cites on a metal oxide layer and decreases surface mobility of the metal oxide layer, so that the whiskers are not formed during a subsequent heating process.

In accordance with the method of the invention, a metal gate electrode having a silicon layer, a conductive barrier layer and a metal layer is formed. A metal gate electrode pattern including the silicon layer, the conductive barrier layer and the metal layer is formed. The selective oxidation process is performed on the metal gate electrode pattern in the nitrogen containing gas ambient.

In the method of making the metal gate electrode, one of nitrogen $N_2$, nitrogen monoxide NO, nitrogen oxide $N_2O$ and ammonia $NH_3$ is used as the nitrogen containing gas. The gases are used by themselves, or one or more of the gases are mixed with each other.

In the method of making the metal gate electrode, the selective oxidation process can be performed at a temperature lower than that of a conventional thermal oxidation process, so that the process margin is increased.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The above and other objects, features and advantages of the present invention will become more apparent from the following detailed description when taken in conjunction with the accompanying drawings.

DETAILED DESCRIPTION OF THE PREFERRED EMBODIMENTS

The present invention relates to a method of forming a metal gate electrode and several processes which are typically performed to form a gate electrode before forming a gate oxide will be omitted. The omitted processes include an isolation process, a well forming process and ion implanting process et al.

Figure 1A:
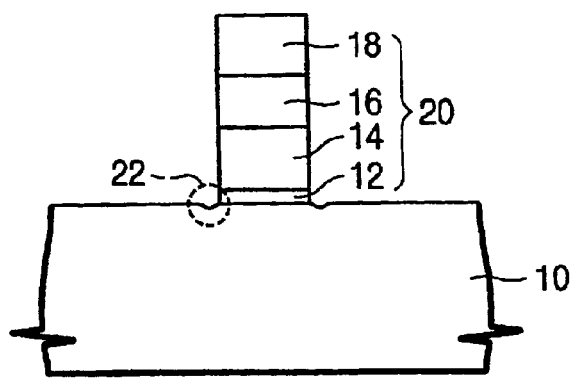
FIGS. 1A and 1B are cross-sectional views showing a method of making a metal gate electrode in accordance with one example of the conventional art.
Figure 1B:
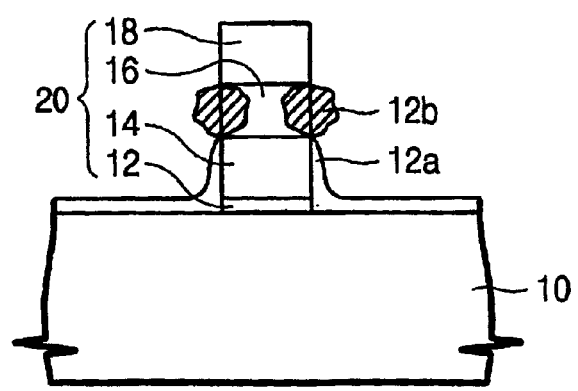
Figure 2A:
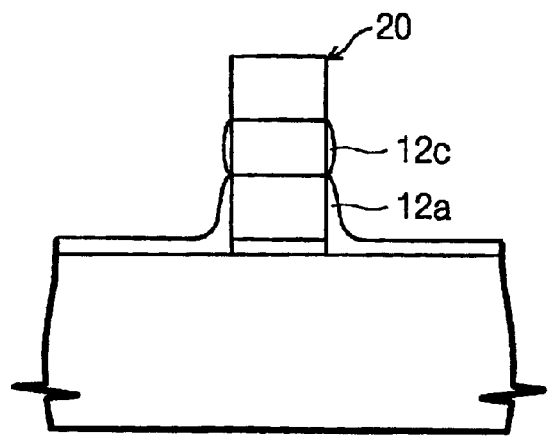
FIGS. 2A and 2B are cross-sectional views showing a method of making a metal gate electrode in accordance with another example of the conventional art.
Figure 2B:
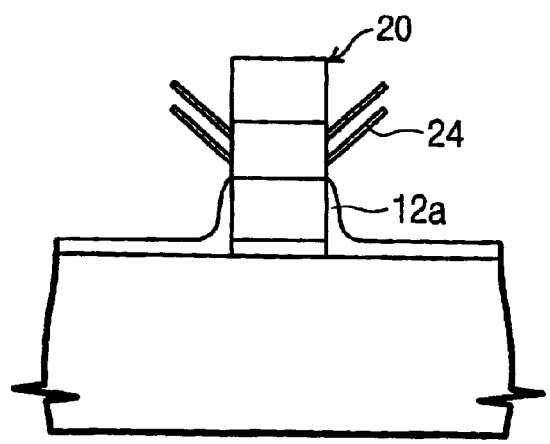
Figure 3A:
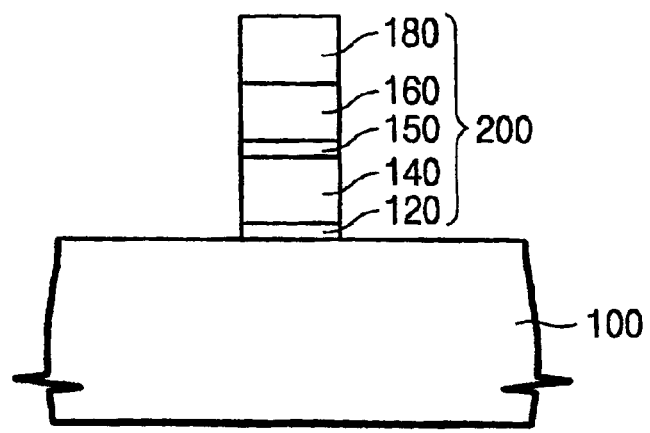
FIGS. 3A and 3B are cross-sectional views showing one embodiment of a method of making a metal gate electrode in accordance with the present invention.

Referring first to FIG. 3A, a gate insulation layer 120 is formed on a semiconductor substrate 100 formed of Si using a well-known method such as a thermal oxidation process or a chemical vapor deposition process. Subsequently, gate electrode materials comprised of a polysilicon layer 140 and a barrier metal layer 150 and a metal layer 160 are formed on the gate insulation layer 120, and a gate electrode capping layer 180 is formed on the metal layer 160. For instance, tungsten nitride, tungsten and silicon nitride are used as the barrier metal layer 150, the metal layer 160 and the gate electrode capping layer 180, respectively. The barrier metal layer 150 is formed to prevent a reaction between the polysilicon layer 140 and the metal layer 160 of tungsten.

Next, a metal gate electrode pattern 200 is formed by sequentially etching the gate capping layer 180, the metal layer 160, the barrier metal layer 150, the polysilicon layer 140 and the gate insulation layer 120. Then, a thermal oxidation process is carried out to cure damage on the semiconductor substrate 100 caused by the etching process and to ensure reliability of the gate insulation layer 120. At this time, the barrier metal layer 150 and the metal layer 160 are minimally oxidized but the semiconductor substrate 100 is sufficiently oxidized because the thermal oxidation process is a selective oxidation process. The selective oxidation process in accordance with the present invention is performed in a mixed gas including oxygen, hydrogen and a nitrogen containing gas. As a nitrogen containing gas, nitrogen $N_2$, nitrogen oxide $N_2O$, nitrogen monoxide NO or ammonia $NH_3$ is used by themselves or are mixed with each other.

Vapor $H_2O$ is formed during the selective oxidation process by reaction of the oxygen gas and the hydrogen gas. As a result, the vapor ambient is formed. Specifically, by adding a sufficient amount of hydrogen more than the amount required to form the vapor, hydrogen $H_2$ rich vapor ambient is formed.

The hydrogen $H_2$ rich vapor is formed in accordance with the following. First, vapor is formed by having of the hydrogen gas and the oxygen gas react each other in an external space of a reaction chamber. Next, further hydrogen gas is mixed with the vapor in the external space, so that hydrogen $H_2$ rich vapor is formed and then introduced into the reaction chamber. At this time, the nitrogen containing gas is introduced into the reaction chamber with the hydrogen $H_2$ rich vapor.

Further, the hydrogen $H_2$ rich vapor can be formed by other methods. That is, the reaction of the hydrogen and the oxygen is performed inside the reaction chamber by introducing a normal amount of the oxygen gas and an excessive amount of the hydrogen gas. Also, at the same time, the nitrogen containing gas is introduced into the chamber during the reaction of the hydrogen gas and the oxygen gas.

The nitrogen is unstably combined with a metal having a high reactivity so as to form metal nitride during the selective oxidation process. Thus, the metal has only a slight possibility of reacting with the oxygen. As a result, oxidation reaction of the metal is minimized, so that a metal oxide is minimally formed.

Further, the nitrogen suppresses a surface mobility of the metal oxide formed on the metal in a minimized amount and cure nucleation cites on the metal oxide. Thus, whiskers are not formed during a subsequent heating process.

Figure 3B:
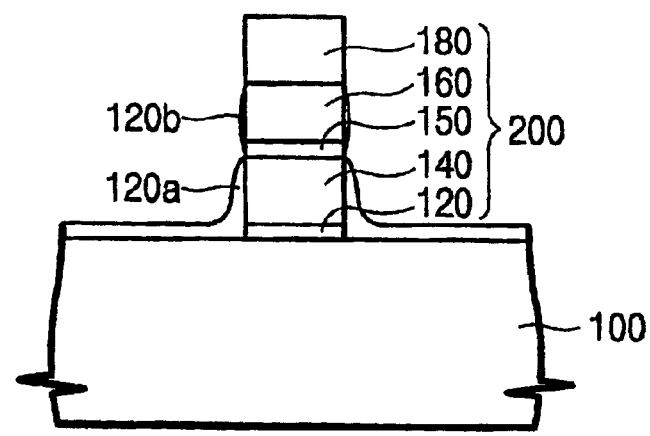

FIG. 3B is a cross-sectional view showing a gate metal electrode after the selective oxidation process was performed. As shown in FIG. 3B, exposed surfaces of the silicon 140, 100 are oxidized, so that silicon oxide layer 120a is formed on the surfaces of the silicon. However the metal layers 150, 160 are minimally oxidized, so that a relatively small size metal oxide layer 120b is formed on a surface of the metal layers 150, 160. Accordingly, whiskers are not formed on the metal oxide layer 120b after the subsequent heating process.

Figure 4A:
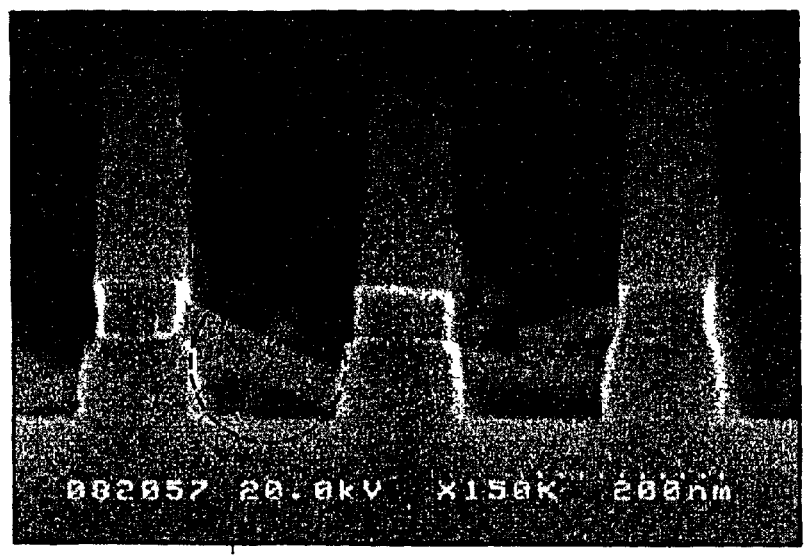
FIG. 4A shows a microscopic pattern of a metal gate electrode manufactured by a conventional method.
Figure 4B:
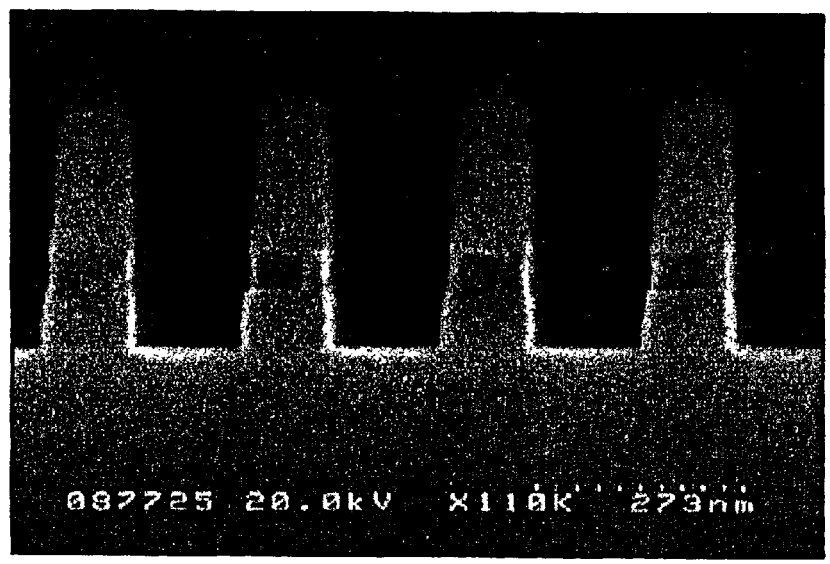
FIGS. 4B and 4C show microscopic patterns of a metal gate electrode manufactured by a method in accordance with the present invention.
Figure 4C:
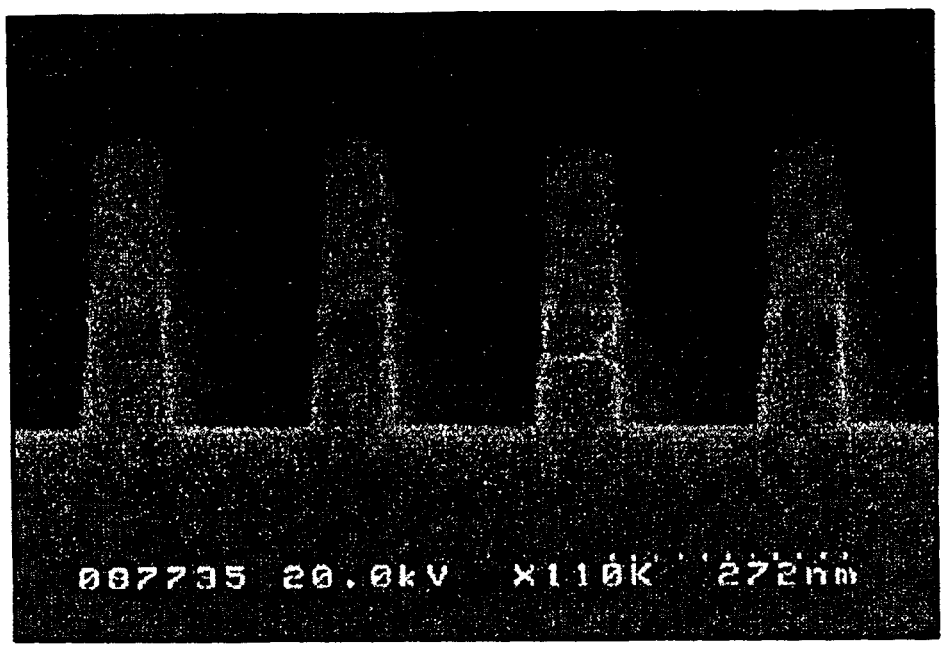

FIG. 4A is a scanning electron microscope (SEM) graph of a metal gate eletrode which is comprised of polysilicon-tungsten nitride-tungsten and formed by a method in according to the conventional art. The metal gate electrode is formed by forming a metal gate electrode pattern, performing a selective oxidation process in accordance with the conventional oxidation process and heating the metal gate electrode pattern. The graph is taken after performing the heating process to examine the whiskers. FIGS. 4B and 4C are SEM graphs of a metal gate electrode which is formed using a selective oxidation process in accordance with the present invention.

Referring to FIG. 4A, the metal gate electrode is formed by performing a selective oxidation process in oxygen and hydrogen ambient at a temperature of about 1000° C. and heating in nitrogen ambient. As shown in FIG. 4A, the whiskers 24 are formed because the metal layer of tungsten is oxidized due to the insufficient oxidation selectivity between tungsten and silicon during the selective oxidation process.

However, referring FIGS. 4B and 4C, the metal gate electrodes are formed by performing a selective oxidation process in accordance with the present invention. The metal gate electrodes shown in FIG. 4B and 4C are formed by performing the selective oxidation process in hydrogen, oxygen and nitrogen ambient at temperatures of 950° C. and 1000° C., respectively, and then heat treated in nitrogen ambient. As shown in FIGS. 4B and 4C, the whiskers are not formed. Accordingly, the nitrogen substantially suppresses the metal oxidation.

Thus, in accordance with the present invention, the process margin is widened because the selective oxidation process can be performed at a temperature of 950° C., lower than 1000° C. at which a conventional selective oxidation process is performed.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method of forming a metal gate electrode having a silicon layer, a conductive barrier and a metal layer, the method comprising the steps of:

forming a metal gate electrode pattern comprised of the silicon layer, the conductive barrier layer and the metal layer; and performing a selective oxidation process to the metal gate electrode pattern in a hydrogen, vapor H2O and nitrogen containing gas in a reaction chamber, wherein the nitrogen containing gas is at least one gas selected for the group consisting of nitrogen monoxide, nitrogen oxide, amonia and combinations thereof, the nitrogen containing gas combining with the metal layer to form a metal nitride during the selective oxidation process.

2. The method according to claim 1, wherein the nitrogen containing gas suppresses oxidation of the conductive barrier layer and the metal layer.

3. The method according to claim 1, wherein the nitrogen permeates a metal oxide layer which is formed during the selective oxidation process on a surface of the conductive barrier layer and the metal layer, decreases surface mobility of the metal oxide layer, and prevents formation of nucleation cites of whiskers on the metal oxide layer.

4. A method of forming a metal gate electrode having a silicon layer, a conductive barrier layer and a metal layer, the method comprising:

forming a metal gate electrode pattern comprised of the silicon layer, the conductive barrier layer and the metal layer; and performing a selective oxidation of the metal gate electrode pattern in hydrogen, oxygen and a nitrogen containing gas in a reaction chamber, wherein the nitrogen containing gas is at least one gas selected from the group consisting of nitrogen monoxide, nitrogen oxide, ammonia and combinations thereof, the nitrogen containing gas combining with the metal layer to form a metal nitride during the selective oxidation process.

5. The method of claim 4, wherein the hydrogen is in an amount sufficient to form hydrogen-rich vapor $H_2O$.

6. The method of claim 5, wherein the nitrogen containing gas suppresses oxidation of the conductive barrier layer and the metal layer.

7. The method of claim 5, wherein the nitrogen permeates a metal oxide layer which is formed during the selective oxidation process on a surface of the conductive barrier layer and the metal layer, decreases surface mobility of the metal oxide layer, and prevents formation of nucleation sites of whiskers on the metal oxide layer.

* * * * *

UNITED STATES PATENT AND TRADEMARK OFFICE
CERTIFICATE OF CORRECTION

PATENT NO.    : 6,764,961 B2
DATED         : July 20, 2004
INVENTOR(S)   : Ja-Hum Ku et al.

It is certified that error appears in the above-identified patent and that said Letters Patent is hereby corrected as shown below:

<u>Column 5,</u>
Line 12, please insert -- layer -- after "a conductive barrier".

Signed and Sealed this

Seventeenth Day of May, 2005

JON W. DUDAS
*Director of the United States Patent and Trademark Office*